(12) United States Patent
Wang et al.

(10) Patent No.: US 7,703,200 B2
(45) Date of Patent: Apr. 27, 2010

(54) PACKAGING METHOD FOR ASSEMBLING SCREW ON PRINTED CIRCUIT BOARD

(75) Inventors: Ting-Jui Wang, Sindian (TW); Ming-De Wu, Sindian (TW)

(73) Assignee: Fivetech Technology Inc. (TW)

( * ) Notice: Subject to any disclaimer, the term of this patent is extended or adjusted under 35 U.S.C. 154(b) by 249 days.

(21) Appl. No.: 12/032,748

(22) Filed: Feb. 18, 2008

(65) Prior Publication Data

US 2009/0205191 A1  Aug. 20, 2009

(51) Int. Cl.
*H01R 9/00* (2006.01)
(52) U.S. Cl. .............................. 29/843; 29/825; 29/842; 411/258
(58) Field of Classification Search ................... 29/825, 29/842, 843; 411/258
See application file for complete search history.

(56) References Cited

U.S. PATENT DOCUMENTS

| | | | | |
|---|---|---|---|---|
| 4,915,557 A | * | 4/1990 | Stafford | 411/107 |
| 5,730,210 A | * | 3/1998 | Kou | 165/80.3 |
| 6,164,980 A | * | 12/2000 | Goodwin | 439/70 |
| 6,282,761 B1 | * | 9/2001 | Bewley et al. | 24/569 |
| 6,477,058 B1 | * | 11/2002 | Luebs et al. | 361/784 |
| 7,232,332 B2 | * | 6/2007 | Osborn et al. | 439/487 |
| 7,342,796 B2 | * | 3/2008 | Aukzemas | 361/719 |
| 2004/0132331 A1 | * | 7/2004 | Osborn et al. | 439/485 |

* cited by examiner

*Primary Examiner*—C. J Arbes
(74) *Attorney, Agent, or Firm*—Schmeiser, Olsen & Watts LLP

(57) ABSTRACT

A packaging method for assembling a screw to a printed circuit board (PCB) includes the steps of: providing a screw having a head, a threaded shank, and a ferrule enclosing the threaded shank; mounting a stop ring on the threaded shank to maintain a predetermined height from top of the head to bottom of the ferrule; using a tool to fetch the screw and align the threaded shank with one through hole provided on the PCB; releasing the screw from the tool for a flange of the ferrule to extend into the through hole on the PCB; heating to melt a solder layer atop of the PCB, so that the ferrule is fixedly held to the PCB when the molten solder layer is cooled and hardened again; and removing the stop ring so that the threaded shank is retracted into the ferrule.

5 Claims, 9 Drawing Sheets

US 7,703,200 B2

PACKAGING METHOD FOR ASSEMBLING SCREW ON PRINTED CIRCUIT BOARD

FIELD OF THE INVENTION

The present invention relates to a packaging method for assembling a screw to a printed circuit board (PCB), and more particularly to a packaging method that enables a screw to be easily and accurately assembled to a PCB without deviation and skew.

BACKGROUND OF THE INVENTION

FIG. 1 shows a conventional screw 5 for using with a printed circuit board (PCB). The screw 5 includes a head 51, a threaded shank 52, and a ferrule 53 having a free end with an axially extended toothed flange 531. The ferrule 53 normally encloses the threaded shank 52 and is retractable into the head 51 under pressure to expose the threaded shank 52, as shown in FIG. 2. To assemble the screw 5 to a PCB 7, first align the ferrule 53 with a through hole 71 provided on the PCB 7, as shown in FIG. 3. Then, apply a downward force on the screw head 51, so that the toothed flange 531 of the ferrule 53 is pressed into the through hole 71, as shown in FIG. 4. And, keep applying the downward force until the toothed flange 531 is completely fitted in the through hole 71 to connect the screw 5 to the PCB 7.

The above-described manner of assembling the screw 5 to the PCB 7 has the following disadvantages:

(a) The ferrule 53 is directly aligned with the through hole 71. However, since the head 51 and the ferrule 53 could not be held together through compression, the screw 5 must be manually positioned above and aligned with the through hole 71.

(b) Since the screw 5 is very small in volume and the through hole 71 has a relatively small diameter, the manual position of the screw 5 above the through hole 71 is subject to error, preventing the flange 531 of the ferrule 53 from being easily and accurately aligned with the through hole 71 and resulting in a poorly assembled or even a damaged PCB 7.

(c) In the event the flange 531 of the ferrule 53 is not pressed into the through hole 71 in one single operation, the flange 531 tends to be incompletely fitted in the through holes 71 and become deviated or skewed due to inaccurate planeness of the PCB 7.

(d) To assemble the screw 5 to the PCB 7 by pressing the toothed flanges 531 of the ferrules 53 into the through holes 71, the screw 5 is individually fetched to the PCB 7. Therefore, the assembly of a large amount of screws 5 to the PCB 7 could not be efficiently carried out using the surface mount technology (SMT) that has been widely employed in the electronic industrial field.

SUMMARY OF THE INVENTION

A primary object of the present invention is to provide a packaging method for assembling a screw to a PCB, so that the screw may be easily and accurately assembled to the PCB with a ferrule of the screw firmly fitted in a through hole provided on the PCB without the risk of becoming deviated or skewed in position.

To achieve the above and other objects, the packaging method of the present invention for assembling a screw to a PCB employs the surface mount technology and includes the following steps:

(1) Providing a screw, which includes a head, a threaded shank projected from a lower end of the head, and a ferrule normally enclosing the threaded shank and elastically movably fitted in the head;

(2) Mounting a stop ring on the threaded shank, such that the stop ring is pressed against a lower end of the ferrule to maintain a predetermined height from top of the head to bottom of the ferrule;

(3) Providing a PCB having a plurality of through holes provided thereon, and applying a layer of solder on a top of the PCB;

(4) Using a tool to fetch the screw and moving the tool to align the threaded shank of the screw with one of the through holes on the PCB;

(5) Releasing the screw from the tool, so that the screw falls with a flange axially extended from the lower end of the ferrule of the screw extending into the through hole on the PCB;

(6) Heating to melt the layer of solder, and allowing the molten solder to cool down to room temperature and become hardened again to thereby fixedly hold the ferrule to the PCB with the flange of the ferrule fixedly fitted in the through hole on the PCB; and (7) Removing the stop ring from the threaded shank of the screw.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
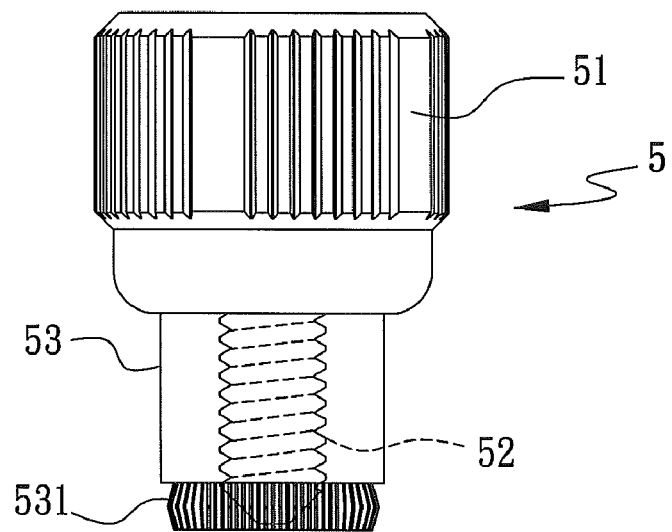
FIG. 1 shows a conventional screw for using with a PCB, wherein a ferrule of the screw is extended from a head of the screw.
Figure 2:
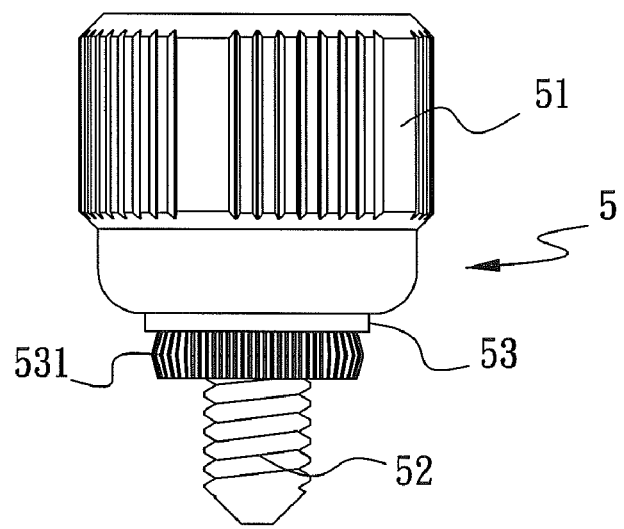
FIG. 2 shows the screw of FIG. 1 with the ferrule thereof retracted into the screw head.
Figure 3:
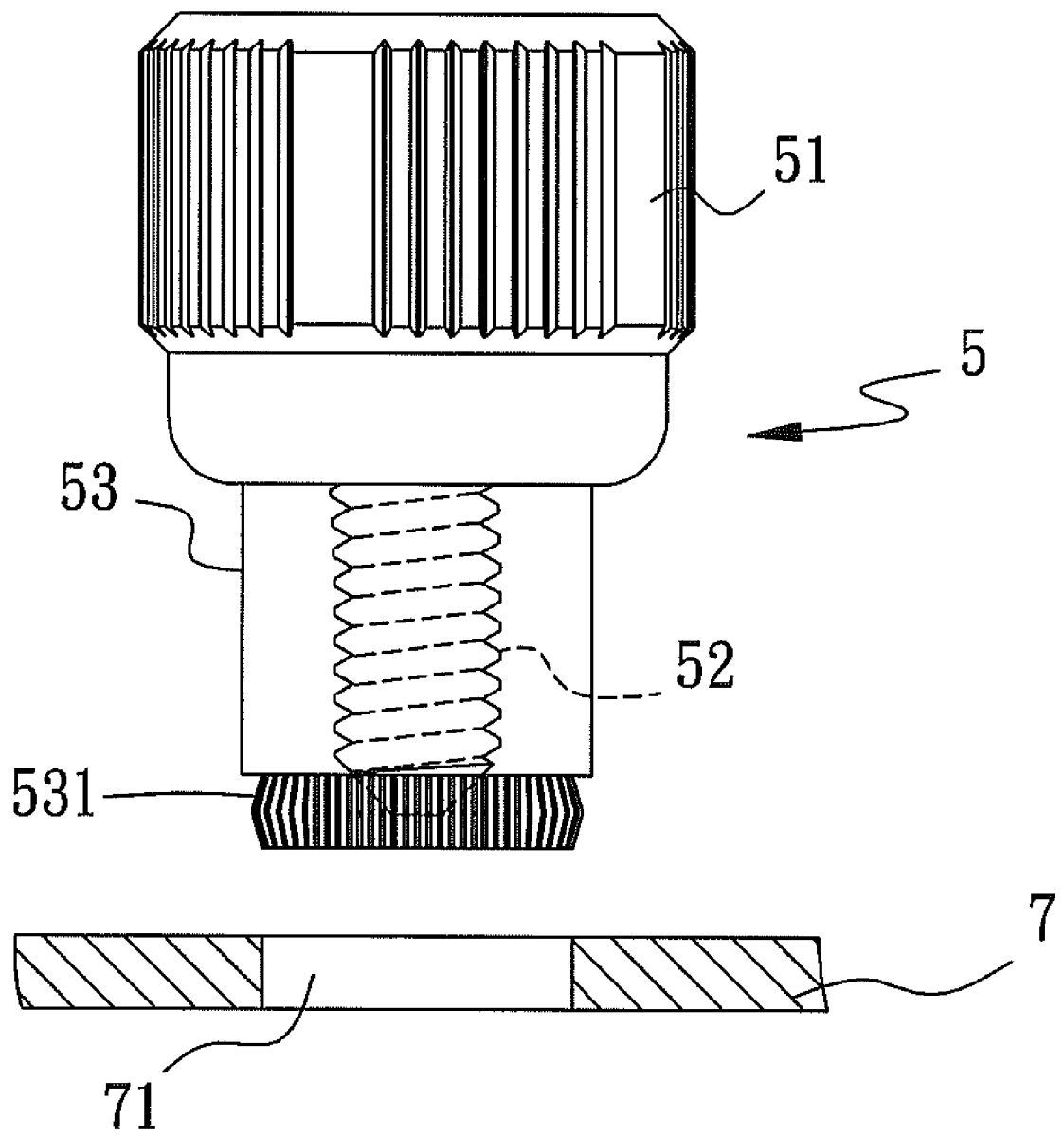
FIGS. 3 to 5 show the steps of assembling the screw of FIG. 1 to a PCB.
Figure 4:
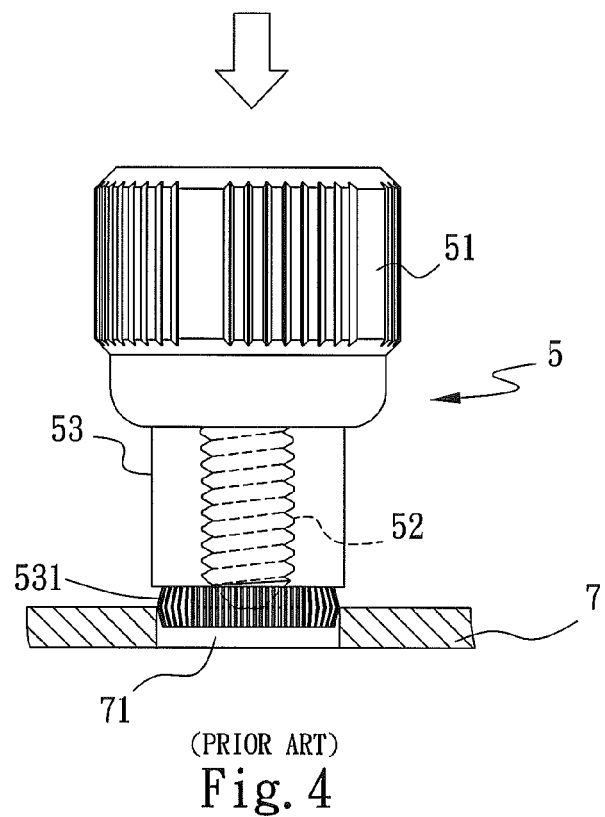
Figure 5:
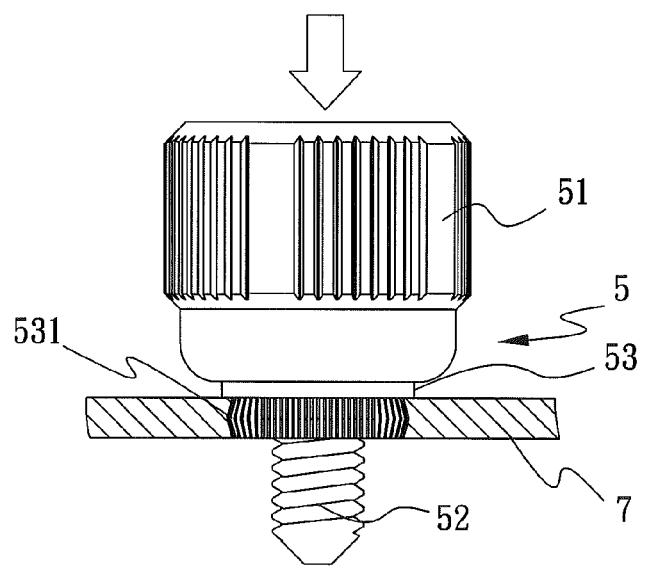
Figure 6:
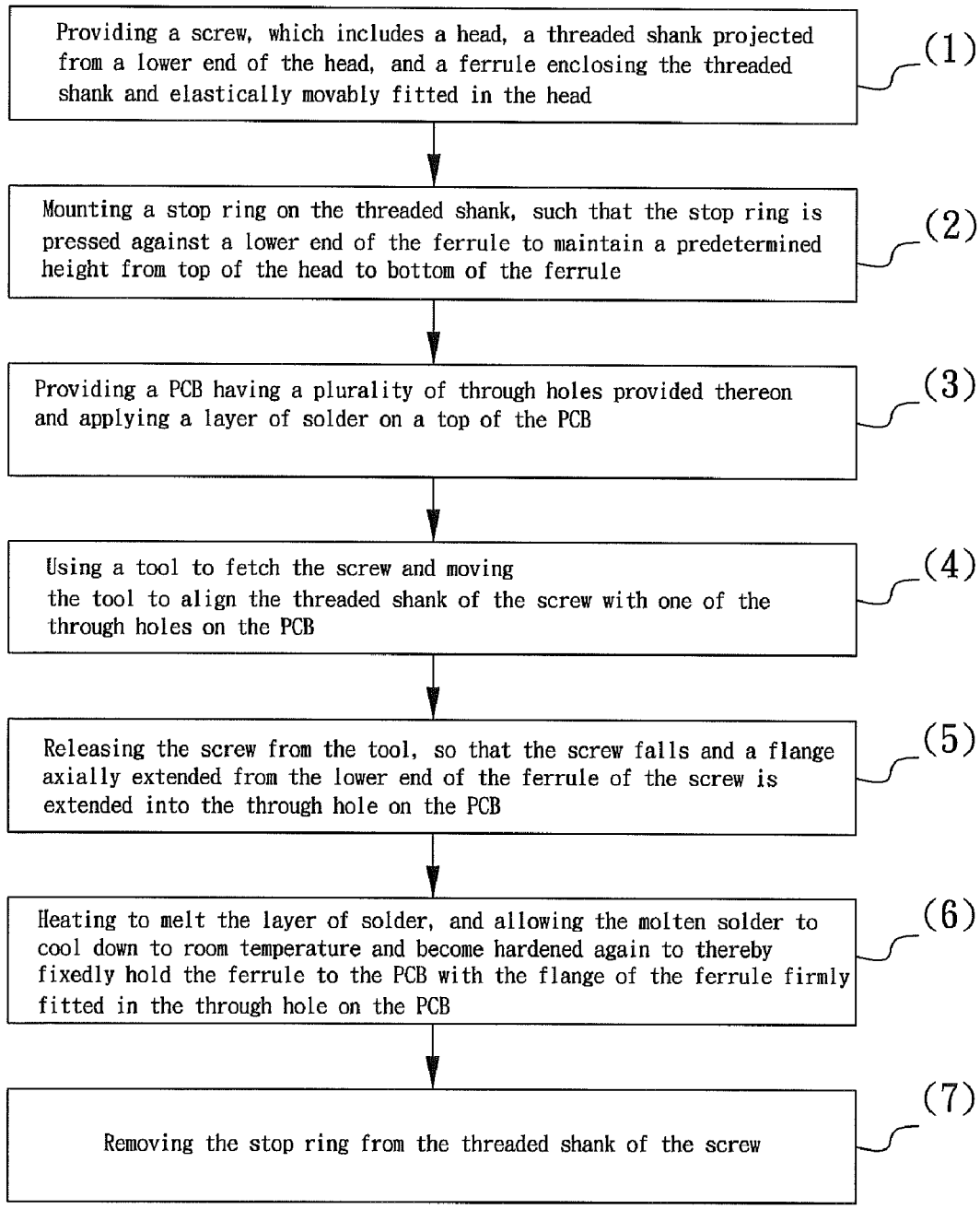
FIG. 6 is a flowchart showing the steps included in a packaging method according to the present invention for assembling a screw to a PCB.

Please refer to FIG. 6 that is a flowchart showing the steps included in the packaging method of the present invention for assembling a screw to a printed circuit board (PCB).

Figure 7:
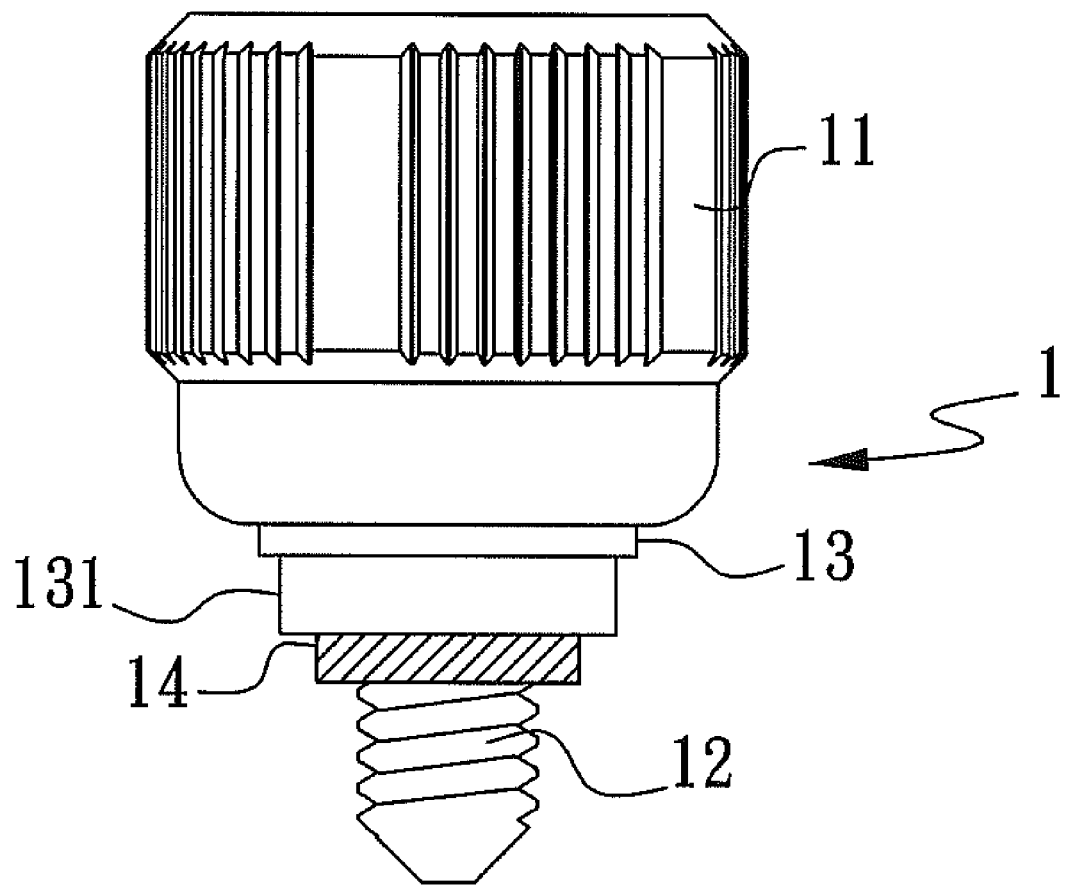
FIG. 7 shows a stop ring is mounted on the screw used in the packaging method of the present invention.

In step (1), a screw 1 is provided. As shown in FIG. 7, the screw 1 includes a head 11, a threaded shank 12 downward extended from a lower end of the head 11, a ferrule 13 enclosing around the threaded shank 12 and elastically movably fitted in the head 11, and a spring (not shown) having an end pressed against the lower end of the head 11 and another end pressed against an upper end of the ferrule 13 normally located in the head 11. With the spring, the ferrule 13 may be elastically retracted into or extended from the head 11.

In step (2), also as shown in FIG. 7, a stop ring 14 is mounted on the threaded shank 12 to press against a lower end of the ferrule 13 normally projected from the head 11, so that a predetermined height from top of the head 11 to bottom of the ferrule 13 is maintained. The stop ring 14 may be an O-ring or a nut.

Figure 8:
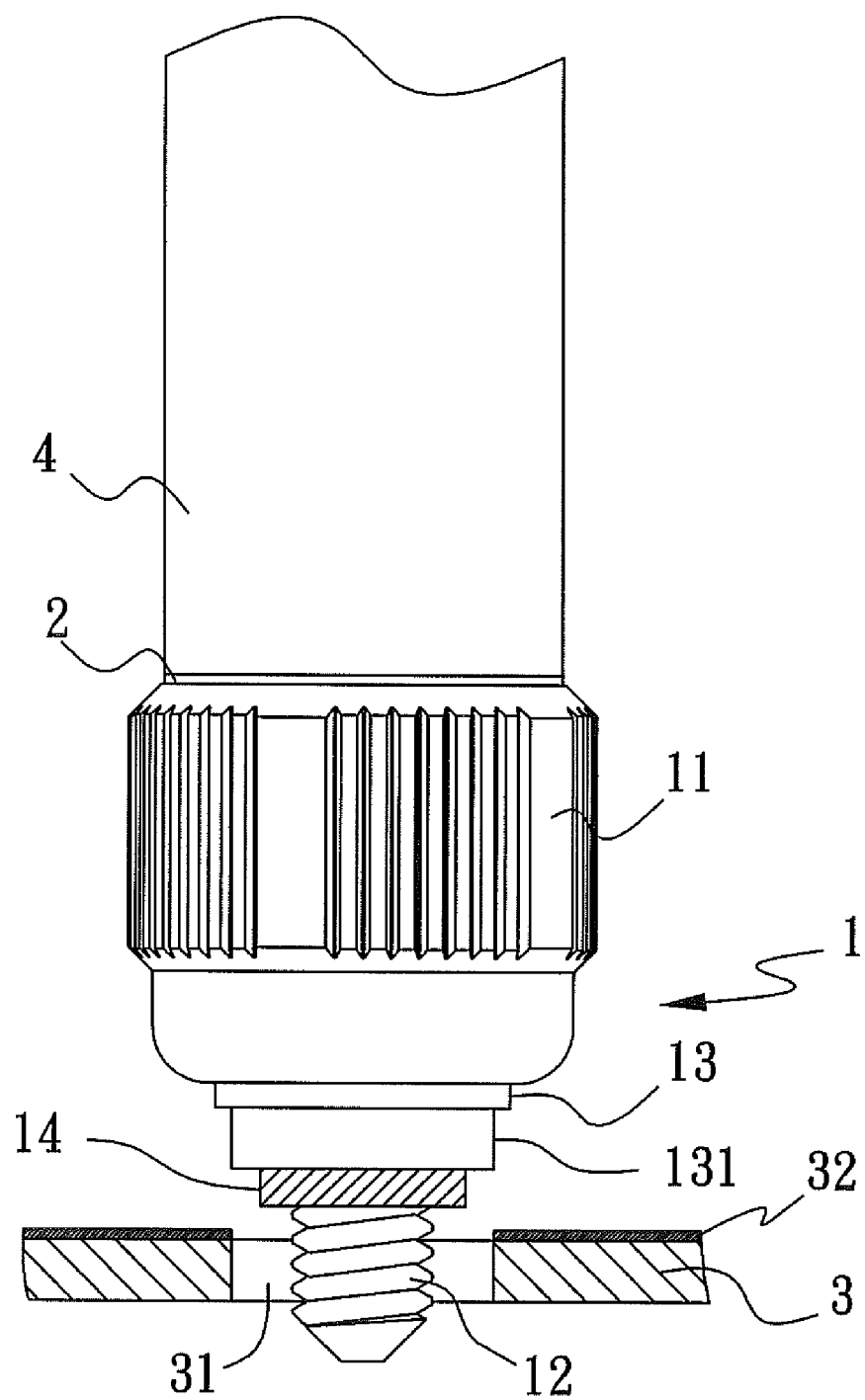
FIG. 8 shows a threaded shank of the screw of FIG. 7 is aligned with a through hole provided on a PCB.

In step (3), also as shown in FIG. 8, a printed circuit board (PCB) 3 having a plurality of through holes 31 is provided, and a layer of solder 32 is applied on a top of the PCB 3.

In step (4), also as shown in FIG. 8, a tool 4 is used to fetch the screw 1 utilizing a layer of glue 2 applying on a top of the screw head 11, and then, the tool 4 is moved to align the threaded shank 12 of the screw 1 with one of the through holes 31 on the PCB 3 while a distance about 0.4 mm is left between the lower end of the ferrule 13 of the screw 1 and the through hole 31. The tool 4 may be a vacuum sucking device without applying the layer of glue 2 on the top of the screw head 11.

Figure 9:
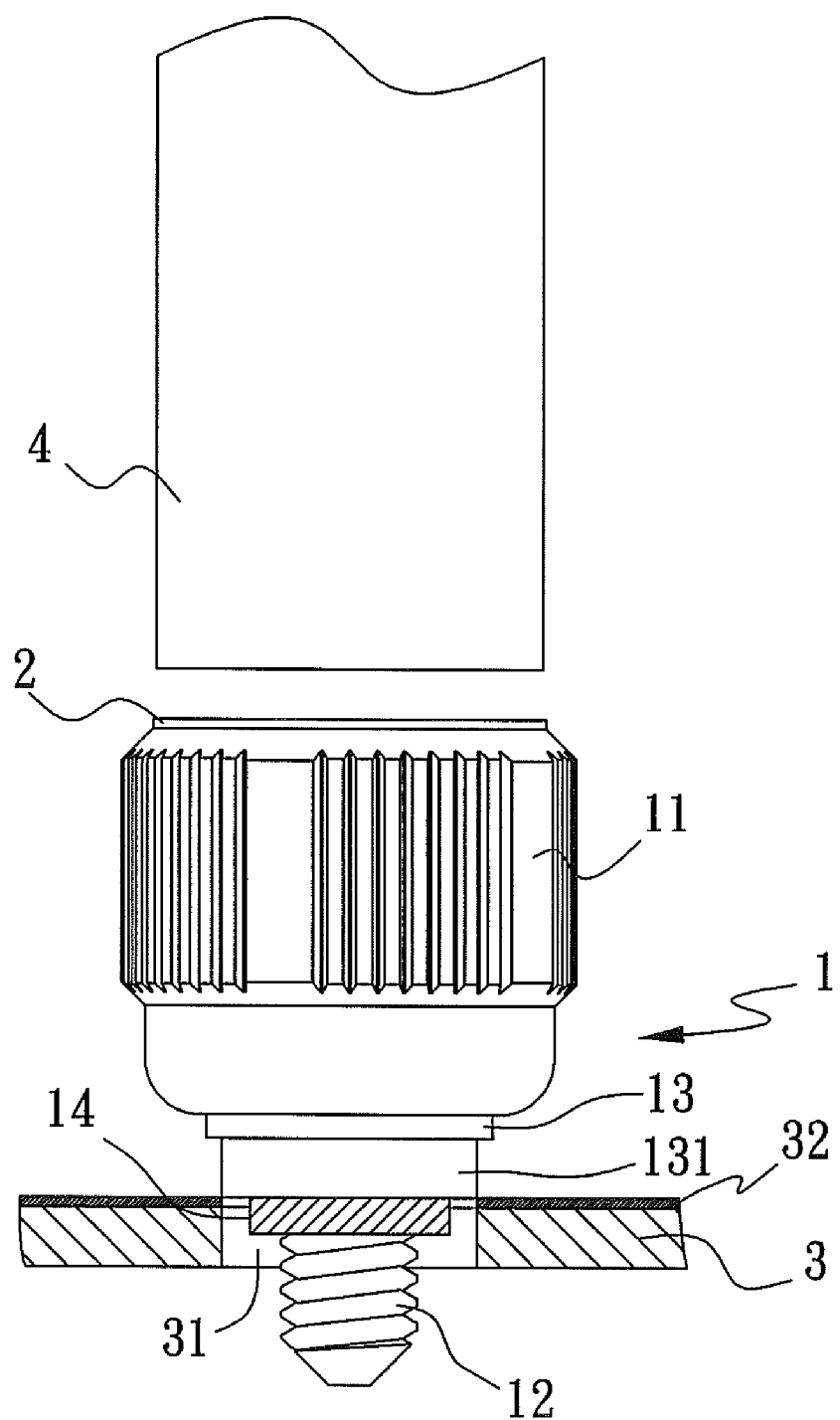
FIG. 9 shows the screw is released from a fetching tool.

In step (5), as shown in FIG. 9, the screw 1 is released from the tool 4 and allowed to fall, so that a flange 131 axially extended from the lower end of the ferrule 13 is extended into the through hole 31.

Figure 10:
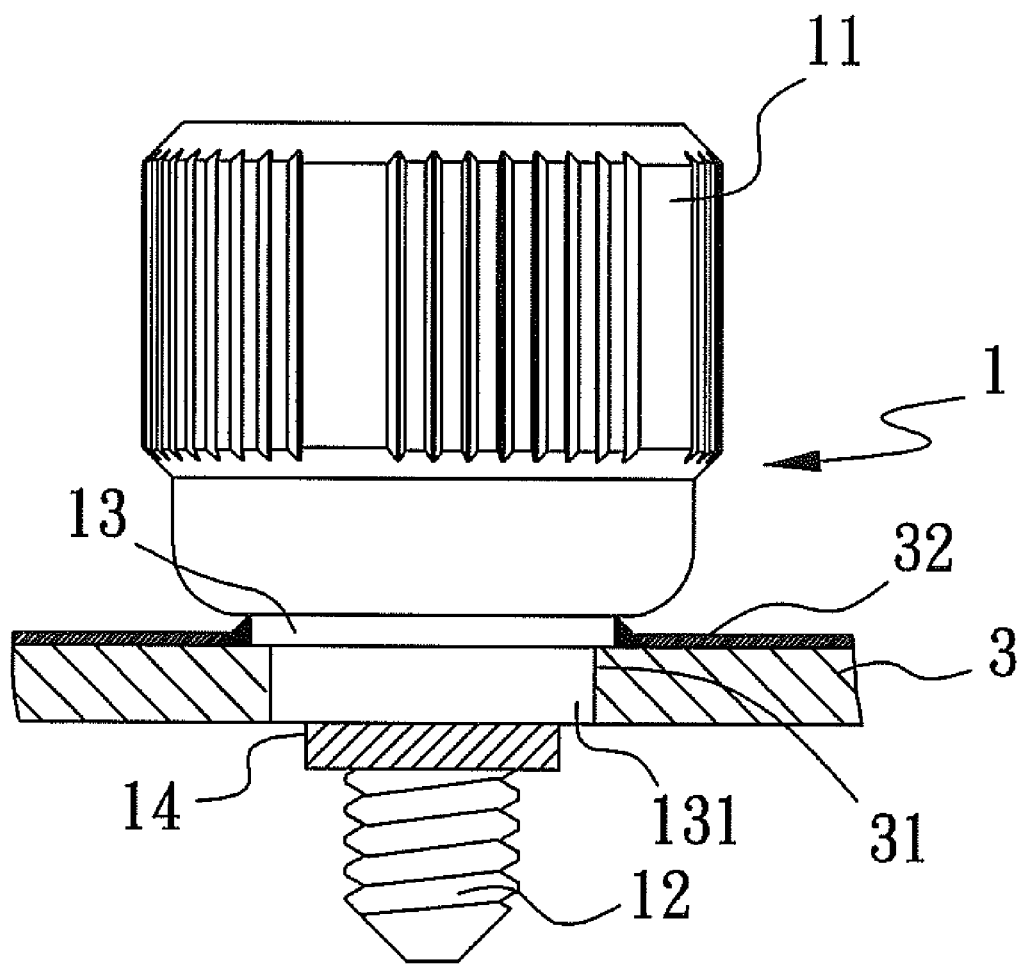
FIG. 10 shows a flange axially extended from a ferrule of the screw is firmly fitted in the through hole on the PCB.

In step (6), as shown in FIG. 10, the layer of solder 32 is heated to melt and then allowed to cool down to room temperature and become hardened again. At this point, the ferrule 13 is fixedly held at the lower end to the PCB 3 with the flange 131 firmly fitted in the through hole 31.

Figure 11:
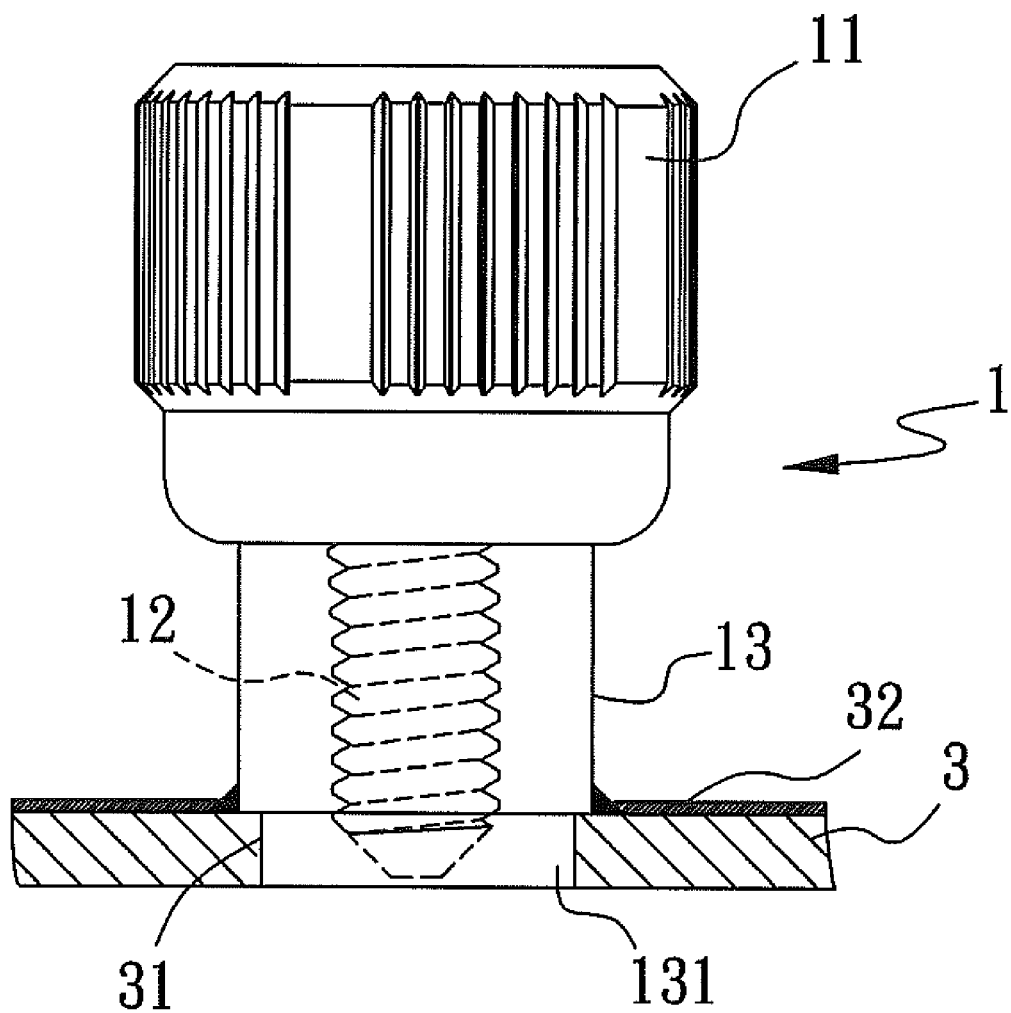
FIG. 11 shows the stop ring is removed and a screw head is sprung upward to retract the threaded shank into the ferrule.

In step (7), as shown in FIG. 11, the stop ring 14 is removed from the threaded shank 12, and the head 11 along with the threaded shank 12 of the screw 1 are automatically sprung upward by the spring, bringing the threaded shank 12 to retract into the ferrule 13 that has already been fixedly held to the PCB 3.

Briefly speaking, when using the packaging method of the present invention to assemble the screw 1 to the PCB 3, first use the stop ring 14 to restrict a portion of the ferrule 13 within the screw head 11 with a part of the threaded shank 12 projected from the lower end of the ferrule 13, so that the screw 1 is packaged to a uniform packaging height from top of the head 11 to bottom of the ferrule 13. Since the threaded shank 12 has a relatively small pointed end, it can be easily extended through the through hole 31 on the PCB 3 and thereby accurately guiding the flange 131 of the ferrule 13 into the through hole 31 without deviation and skew.

With the packaging method of the present invention, the ferrule 13 of the screw 1 may be easily and accurately held to the PCB 3 without deviation and skew to thereby enable the assembly of the screw 1 to the PCB 3. Therefore, the present invention effectively overcomes the problems in the conventional manner of mounting a screw on a PCB.

What is claimed is:

1. A packaging method for assembling a screw to a printed circuit board (PCB), comprising the steps of:
    (a) Providing a screw, which includes a head, a threaded shank projected from a lower end of the head, and a ferrule enclosing the threaded shank and elastically movably fitted in the head;
    (b) Mounting a stop ring on the threaded shank, such that the stop ring is pressed against a lower end of the ferrule to maintain a predetermined height from top of the head to bottom of the ferrule;
    (c) Providing a PCB having a plurality of through holes provided thereon, and applying a layer of solder on a top of the PCB;
    (d) Using a tool to fetch the screw and moving the tool to align the threaded shank of the screw with one of the through holes on the PCB;
    (e) Releasing the screw from the tool, so that the screw falls and a flange axially extended from the lower end of the ferrule of the screw is extended into the through hole on the PCB;
    (f) Heating to melt the layer of solder, and allowing the molten solder to cool down to room temperature and become hardened again to thereby fixedly hold the ferrule to the PCB with the flange of the ferrule firmly fitted in the through hole on the PCB; and
    (g) Removing the stop ring from the threaded shank of the screw.

2. The packaging method for assembling a screw to a PCB as claimed in claim 1, wherein the screw further includes a spring; and the spring being pressed at an end against the lower end of the head of the screw and at another end against an upper end of the ferrule of the screw.

3. The packaging method for assembling a screw to a PCB as claimed in claim 1, wherein the stop ring is selected from the group consisting of an O-ring and a nut.

4. The packaging method for assembling a screw to a PCB as claimed in claim 1, wherein the tool is a vacuum sucking device.

5. The packaging method for assembling a screw to a PCB as claimed in claim 1, wherein the tool fetches the screw by utilizing a layer of glue applying on the top of the screw head.

\* \* \* \* \*